United States Patent [19]

Darmouni

[11] 4,454,487
[45] Jun. 12, 1984

[54] ODD ORDER SELF-CORRECTED ELECTRIC FILTERS

[75] Inventor: Corinne Darmouni, Paris, France

[73] Assignee: Thomson-CSF, Paris, France

[21] Appl. No.: 360,003

[22] Filed: Mar. 19, 1982

[30] Foreign Application Priority Data

Mar. 20, 1981 [FR] France .................. 81 05658

[51] Int. Cl.³ .................. H03H 7/03; H03H 7/075
[52] U.S. Cl. .................. 333/28 R; 333/170
[58] Field of Search .................. 333/17 R, 28 R, 167, 333/170, 168, 171, 213, 214

[56] References Cited

U.S. PATENT DOCUMENTS

| 2,308,013 | 1/1943 | Lee | 333/170 |
|---|---|---|---|
| 3,464,034 | 8/1969 | Liljeberg | 333/167 |
| 3,967,210 | 6/1976 | Aumann | 333/213 X |
| 4,032,866 | 6/1977 | Schmidt | 333/28 R |

FOREIGN PATENT DOCUMENTS 1471194 1/1967 France .
55-156414 12/1980 Japan .................. 333/168

OTHER PUBLICATIONS

Atia et al., *Nonminimum-Phase Optimum-Amplitude Bandpass Waveguide Filters*, IEEE Trans. on MTT, Apr. 1974, pp. 425-431.
Electronic Industries, vol. 23, No. 1, Jan. 1964.
IEEE Transactions on Circuits and Systems, vol. CAS-24, No. 5, May 1977, New York.
IEEE Transactions on Microwave Theory and Techniques, vol. MTT-20, No. 4, Apr. 1972.

*Primary Examiner*—Paul L. Gensler
*Attorney, Agent, or Firm*—Oblon, Fisher, Spivak, McClelland & Maier

[57] ABSTRACT

The odd order auto-corrected electric filter comprises first input matching means for receiving the input signal and transmitting it to filter means for bringing about a broad band filtering of the signal and transmitting it to second output matching means. Correction means placed between at least two filter members bring about a self-correction of the envelope delay and/or an amplitude correction.

2 Claims, 8 Drawing Figures

ODD ORDER SELF-CORRECTED ELECTRIC FILTERS

BACKGROUND OF THE INVENTION

The present invention relates to odd order self-corrected electric filters with elements having localized constants of the band-pass type, which make it possible to filter analog or digital signals in this frequency band and which make it possible to correct the distortion of the envelope delay and/or correct the amplitude in said frequency band.

Such filters are particularly useful in radio receivers. In one construction of such receivers, conventional electric filters are used. However, conventional filters do not correct the distortion of the envelope delay and/or amplitude, which is often a disadvantage for the transmission of the signal. The passage time at the different frequencies of the pass band is not constant. Thus, the envelope delay increases from a low value for the centre frequencies to a high value for the limit frequencies of the pass band. The correction function of the envelope delay is brought about by correcting networks. These networks frequently comprise one or more cells incorporating active elements. When there are several cells in the correcting network, each cell is insulated from the adjacent cells by a transistor. These correcting networks are connected in cascade following the filter. In the case of a radio receiver, it is conventional practice to use two cells in cascade for correcting the envelope delay. The centre frequencies of the two cells are positioned on either side of the centre frequency of the band-pass filter which it is desired to compensate. However, the amplitude remains linked with the correction of the envelope delay.

In certain ultra-high frequency applications, microwave filters with a narrow pass band are used. The correction function of the envelope delay is obtained by using coupled multiple cavities. The synthesis of these filters has been described in the technical literature, as is shown by the following publications:

J. D. RHODES "filtre généralisé à phase linéaire par cavité à couplage direct", IEEE Transactions MTT, vol. MTT 18, June 1970, pages 308 to 313;

A. E. Atia et al "filtres guides d'ondes à bande étroite", IEEE Transactions MTT, vol. MTT 20, no. 4, April 1972, pages 258 to 264;

A. E. Atia et al "Synthèse des cavités multiples couplées à bande étroite", IEEE Transactions CAS, vol. CAS-21, no. 5, September 1974, pages 649 to 655.

The disadvantages of these two types of filters are described hereinafter. Waveguide filters with a narrow band and coupled multiple cavities cannot be used at low or intermediate frequencies for dimensioning reasons and excessive overall dimensions. Coventional filters equipped with correcting networks involve the use of special supply systems for the active cells. In addition, they have particularly large overall dimensions and are not always very reliable.

SUMMARY OF THE INVENTION

To obviate the aforementioned difficulties, the present invention proposes an odd order self-corrected electric filter having elements with localized constants comprising first input matching means for receiving the input signal, matching it and transmitting it to filter means consisting of a system of an odd number of filter members in cascade for filtering the signal and transmitting it to second output matching means, and which also comprises correction means constituted by coupling means placed between at least two filter members in order to bring about a self-correction of the envelope delay and/or an amplitude correction.

BRIEF DESCRIPTION OF THE DRAWINGS

The invention is described in greater detail hereinafter relative to non-limitative embodiments and the attached drawings, in which.

DETAILED DESCRIPTION OF THE PREFERRED EMBODIMENTS

Figure 1:
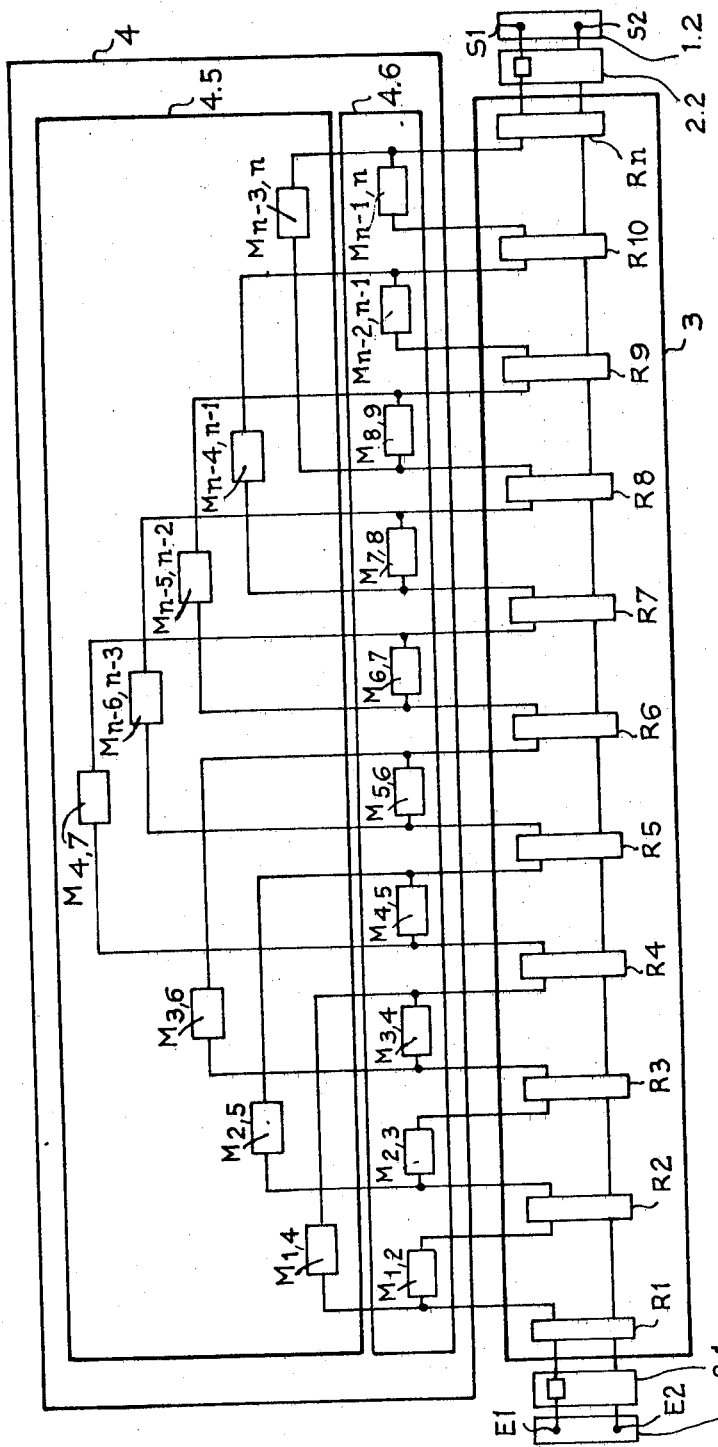
FIG. 1 shows a circuit diagram of the odd order self-corrected electric filter.
Figure 5:
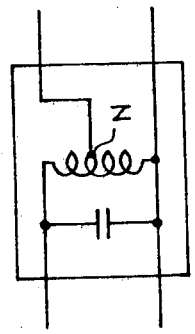
FIG. 5 is a second connection procedure for a resonator.
Figure 4:
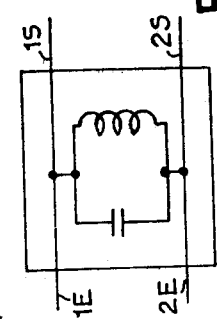
FIG. 4 is a first connection procedure for a resonator.

The odd order self-corrected electric filter according to the invention, whose circuit diagram is shown in FIG. 1, receives the input signal by a first pair of input terminals E1, E2, which constitute the input of the filter. An input impedance matching device 2.1 receives this signal in order to match it and transmit it to the filter means. The input impedance matching device 2.1 has two inputs and two outputs, the latter being connected to the inputs of the filter means. The latter have two inputs, two outputs and are constituted by a number n of resonators ($R_1$ ... $R_n$), n being an odd integer. In the circuit diagram there has been a limitation to n=11. Each resonator has a first and a second input, as well as a first and a second output. The outputs of a first resonator are directly or indirectly connected to the inputs of a second resonator. This connection is called cascade connection. The two outputs of the filter means 3 are connected to an output impedance matching device 2.2. The two outputs of filter means 3 are the two outputs of the latter resonator. The two outputs of the output impedance matching device 2.2 are connected to a second pair of output terminals $S_1$ and $S_2$ which constitute the filter outputs. The envelope delay and/or amplitude self-correction means 4 comprise a system of adjacent coupling means 4.6 and a system of non-adjacent coupling means 4.5. The self-correction means 4 are connected to filter means 3 via adjacent coupling means 4.6. The latter are constituted by elements having localized constants $M_{i,j}$. Each resonator has an output connected to one input of the adjacent resonator via an adjacent coupling means $M_i, j$. $M_{i,j}$ is such that $i=1,2...,n-1, j=i+1$. It represents the coupling ith resonator and jth resonator, the latter following it. The self-correction means 4 also have non-adjacent coupling means 4.5 constituted by elements having localized constants $M_k, 1$. These non-adjacent coupling means are connected between the first output of the kth resonator and the first input of the lth resonator, whereby k can be equal to 1, 2, 3 . . . (n−3), 1 being equal to k+3. For n=11 the following couplings exist:

M1,4 between the 1st and 4th resonator
M2,5 between the 2nd and 5th resonator
M3,6 between the 3rd and 6th resonator
M4,7 between the 4th and 7th resonator
M5,8 between the 5th and 8th resonator
M6,9 between the 6th and 9th resonator
M7,10 between the 7th and 10th resonator
M8,11 between the 8th and 11th resonator FIGS. 4 and 5 show the circuit diagram of the resonators. FIG. 4 shows a first way of connecting a non-adjacent coupling means to a first output of a resonator. FIG. 5 shows a second connection procedure.

The two resonators in FIGS. 4 and 5 have an identical construction. They conventionally comprise a capacitor in parallel with an inductance (and optionally a resistor in parallel with the inductance or capacitor for damping the resonator) having predetermined values so as to resonate at the tuning frequency. The resonators have two inputs and two outputs.

In FIG. 4 the resonator has a first input and a first output and receives the same first potential. The second input and second output receive the same second potential. The adjacent coupling means corresponding to said resonator is connected to the first output.

FIG. 5 differs from FIG. 4 in one point. The first output is in this case placed at a central point N of the inductance. The non-adjacent coupling means is connected to said point N.

Figure 2:
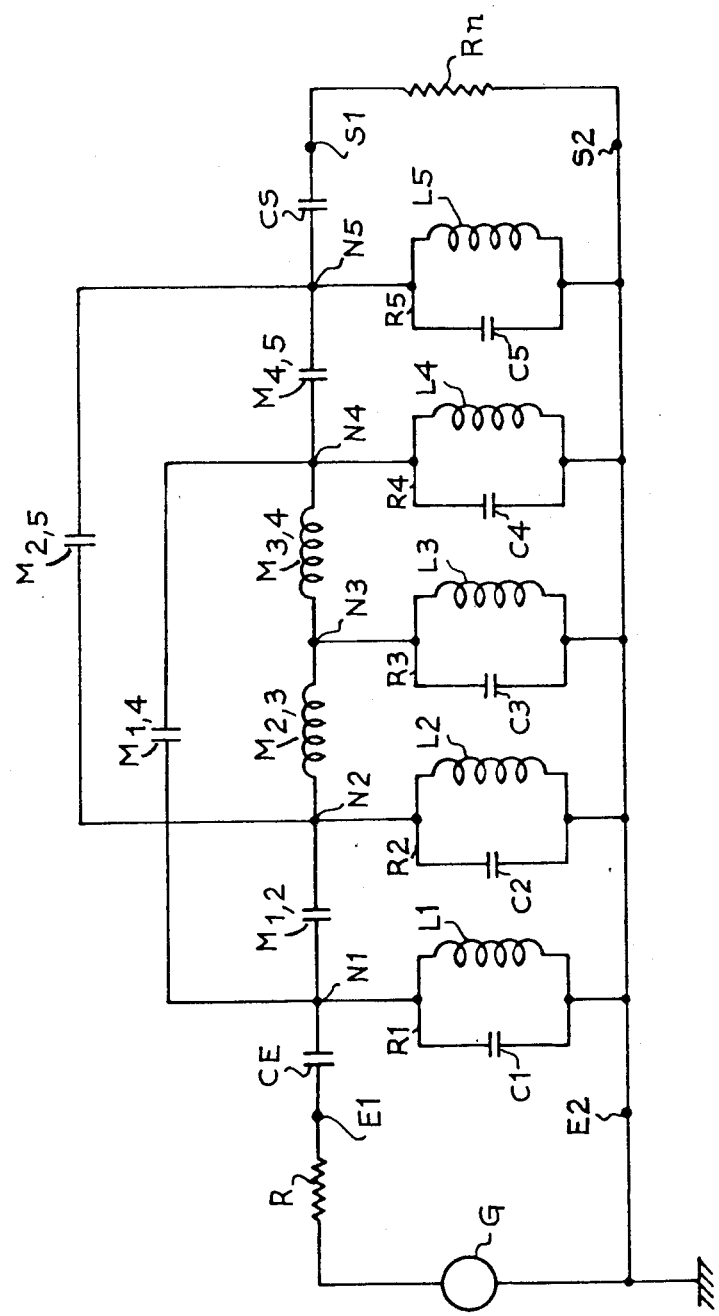
FIG. 2 is a first embodiment of the filter according to the invention.

FIG. 2 shows a special embodiment of the filter according to the invention. The filter is designed for a centre frequency in the range of intermediate frequencies around 70 MHz. In this particular case the 3 dB pass band is 1.25 MHz.

By referring to the circuit diagram of FIG. 1 and using the embodiment of FIG. 2, we obtain a filter having the characteristics of the invention. The correction of the envelope delay physically leads to an improvement in the transmission of the signal. This correction can also be observed on the time delay curve in FIG. 3.

Thus, the following description refers to the circuit diagram of FIG. 1 and the embodiment of FIG. 2. The filter is supplied by a receiver mixer represented in the diagram by a generator G supplying a signal of frequency 70 MHz and amplitude Vo. The internal impedence R of generator G is 75Ω. The signal supplied by the generator is applied to the input of the filter between input terminals E1 and E2. The second input E2 of the filter is at potential 0. The impedance matching devices 2.1 and 2.2 are capacitors CE and CS. Capacitor CE is connected between input E1 and the first input of the first resonator R1. Capacitor CS is in series between output S1 and the final resonator R5. The two capacitors are equal to 5.18 pF in this embodiment, bearing in mind the signal generation means. The filter means 3 are constituted by 5 resonators R1, R2 . . . R5. Each resonator is identical to that shown in FIG. 4. The first input 1E and the first output 1S of the resonators are at the same potential which, for each resonator, constitutes a node N1, N2 . . . N5. The second inputs and second outputs are at potential 0. Each resonator is connected to the following resonator via adjacent coupling means. The adjacent coupling means M1,2 and M4,5 connect respectively between the first and second resonators and the fourth and fifth resonators are capacitive elements. The adjacent coupling means M2,3 and M3,4 connected respectively between the third and fourth resonators and the fourth and fifth resonators are self-inductive elements. The non-adjacent coupling means M1,4 between the first and fourth resonators is capacitive. The non-adjacent coupling means between the second and fifth resonators is capacitive. It is obvious that each inductance can be replaced by an equivalent element, either a clearly defined inductance in series with a clearly defined capacitor, or an inductance in parallel with a capacitor, or three inductances connected in T form, i.e. a first inductance in series with a second inductance and a third connected between the common point of the two first inductances and potential S2. The values of the adjacent or non-adjacent coupling means are determined on the basis of the filter synthesis method. The latter consists of finding the coupling matrix and matching coefficients for obtaining a requisite filter transfer function. It is known for narrow pass bands. The results obtained are consequently not optimized. The calculations of the self-inductive and capacitive elements are carried out on the basis of the following equations:

$$Lij = \frac{R \cdot Rn}{2\pi fo\, Mij}$$

$$Cij = \frac{Mij}{2\pi fo\, R \cdot Rn}$$

The self-inductive and capacitive elements of the resonators are calculated on the basis of the following equations:

$$L = \frac{R \cdot Rn}{2\pi fo} \left( \frac{fp}{fo} - \frac{fo}{fp} \right)$$

$$C = \frac{1}{4\pi^2 fo^2 L}$$

fo being the centre frequency of the filter, fp the higher frequency of the final ripple, R the internal resistance of the generator, Rn the resistance of the load and Mi,j the term of order i,j of the coupling matrix M.

A first group of results is obtained on the basis of these equations and use is made of the optimization method of K. MADSEN, H. SCHIAER-JACOBSEN, J. VOLDBY described in "Automated Minimax Design of networks", IEEE-Cir. and Syst., vol. CAS-22; no. 10, October 1975, pp. 791-795. This optimization method makes it possible to reduce the deviations between the ideal response of the filter H(Fj) and the true response H₀(Fj) for a given frequency Fj. Two criteria are envisaged for measuring the quality of the true response and for guiding the optimization in order to improve the quality. Thus, cosideration is either given to the mean standard deviation of m functions H(Fj)

$$Eq = \frac{1}{m}\sqrt{\sum_{j=1}^{m} H(Fj) - H_0(Fj)^2}$$

or the maximum deviation of m functions H(Fj)

$$E_{max} = \max(H(Fj) - H_0(Fj))$$

The optimization method takes account of the losses on each element. Thus, this method presupposes that each element is not perfect, because it has resistive characteristics at the resonant frequency. An inductance Lo is equivalent to an inductance L in series with a resistor R equal to $L\, 2\pi fo/Q1$ in which Q1 is the overvoltage coefficient of inductance L and R represents the losses. A capacitor Co is equivalent to a capacitor C in parallel to a resistor R equal to $Qc/C2\pi fo$ in which Qc is the overvoltage coefficient of capacitor C.

The optimization method is an iterative method. For each iteration, a non-linear problem to be solved is replaced by a linear approximation. When the required accuracy is reached the iteration is stopped. The results are optimized by adjusting the couplings obtained as a function of the frequency. The choice of an odd number of resonators makes it possible to more easily obtain, for a given amplitude curve, the correction of the envelope delay curve. In the first two embodiments an attempt was made to bring about a self-correction of the envelope delay and an arithmetic symmetry of the amplitude about the centre frequency without worrying about the attenuation of the out-of-band amplitude. An amplitude curve with minimum undulation is obtained and also has an arithmetic symmetry relative to the centre frequency Fo. Thus, an arithmetic symmetry of the envelope delay curve is also obtained. For the example described the following results are obtained:

M1,2=M4,5=0.597 pF

M2,3=M3,4=13417 nH

M1,4=0.09 pF

M2,5=0.09 pF

C1=C5=34.135 pF

C2=C4=39.555 pF

C3=40.535 pF

L1=L2= ... =L5=130 nH

Figure 3:
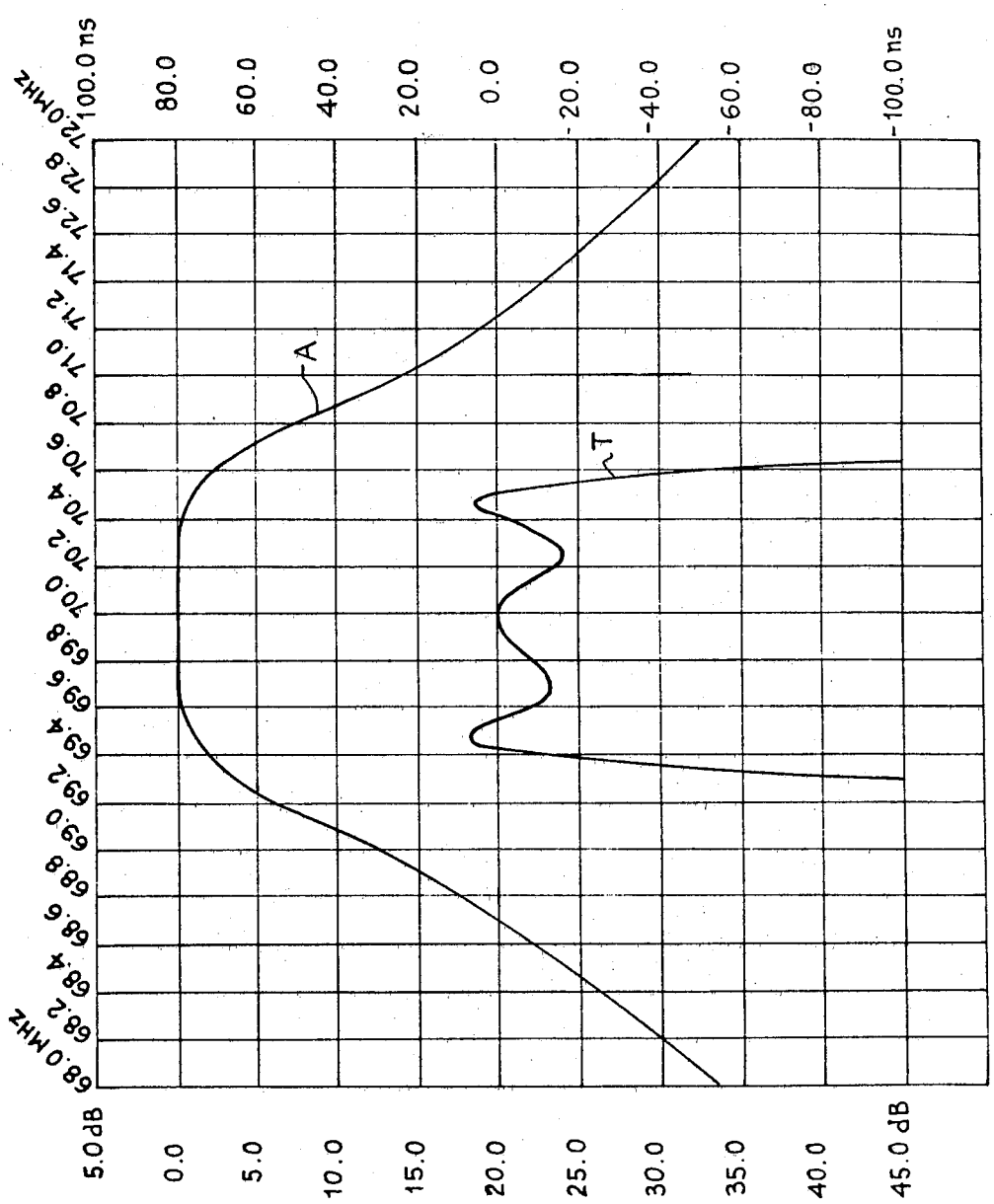
FIG. 3 shows amplitude and envelope delay curves for a given frequency band according to the first embodiment of the filter.

The amplitude curve A of the filter is shown in FIG. 3. The frequency values in MHz are plotted on the abscissa. The gain or amplitude attenuations in decibels are plotted on the ordinate. The arithmetic symmetry of the filter is shown by a symmetry of the curve with respect to the centre frequency. There is an arithmetic symmetry up to 25 dB of out-of-band suppression. This means that there is still a symmetry beyond the critical frequencies for a 25 dB attenuation. This attenuation curve has steep slopes with substantially the same configuration at the two critical frequencies. This is due to the arithmetic symmetry characteristics of the filter.

The envelope delay curve T is also shown in FIG. 3. The frequencies in MHz are plotted on the abscissa and the times in nanoseconds on the ordinate. It can be seen that the envelope delay curve has the same characteristic as the attenuation curve, namely the arithmetic symmetry. It can also be seen that there is virtually no variation in the time delay between 69.4 and 70.5 MHz. The difference between 69.4 and 70.5 MHz represents roughly 80% of the useful band of the filter. There is consequently a very good correction of the envelope delay variation in 80% of the useful band.

Figure 6:
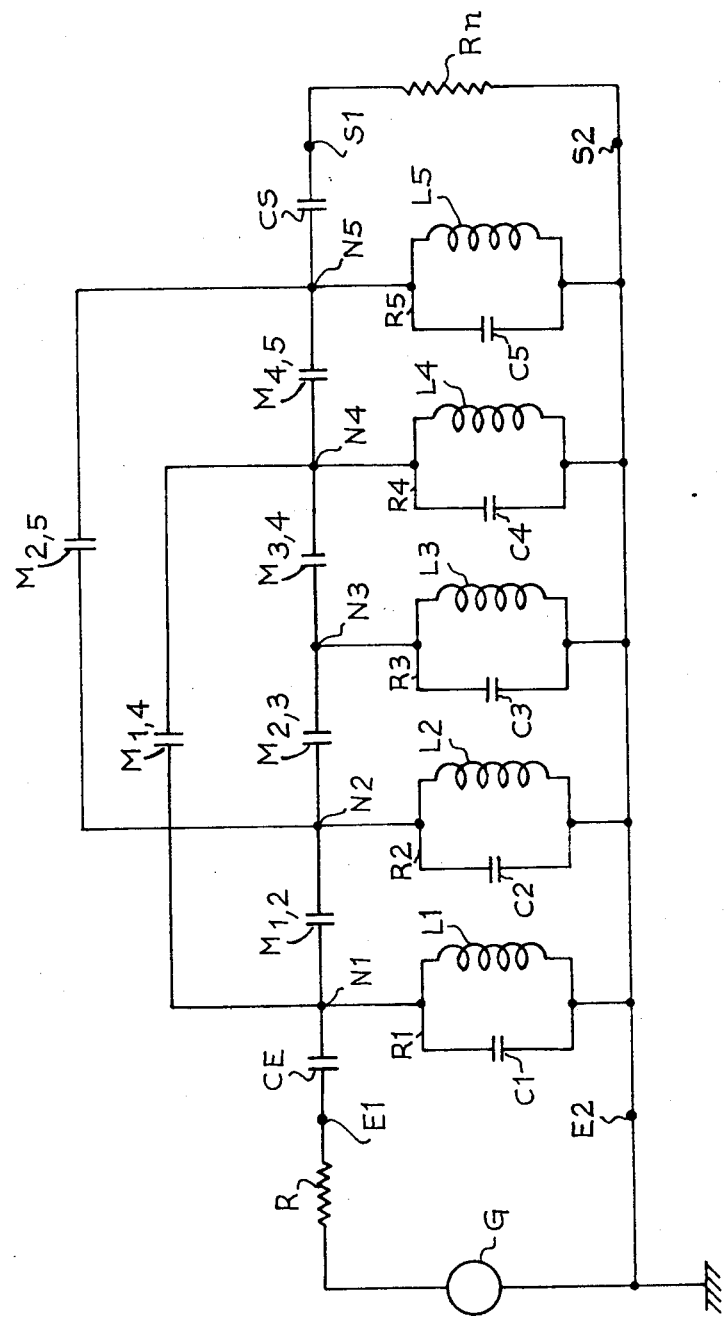
FIG. 6 shows a second embodiment of the filter according to the invention.

The following description refers to the circuit diagram of FIG. 1 and the embodiment of FIG. 6. In this second embodiment of FIG. 6, the number of resonators is the same as in the first embodiment. The supply and load conditions are the same as in the first embodiment. The impedance matching devices 2.1 and 2.2 are capacitors CE and CS equal to 5.18 pF, taking account of the signal generation means.

All the adjacent coupling means, i.e. M1,2, M2,3, M3,4, M4,5 are capacitive. All the non-adjacent coupling means, i.e. M1,4 and M2,5 are also capacitive. The following relationships and results are obtained:

M1,2=M4,5=0.597 pF

M2,3=M3,4=0.385 pF

M1,4=0.09 pF

M2,5=0.09 pF

C1=C5=34.135 pF

C2=C4=38.783 pF

C3=38.995 pF

L1=L2= ... =L5=130 nH

The results are obtained for a centre frequency substantially equal to 70 MHz and a pass band roughly equal to 1.25 MHz.

Figure 8:
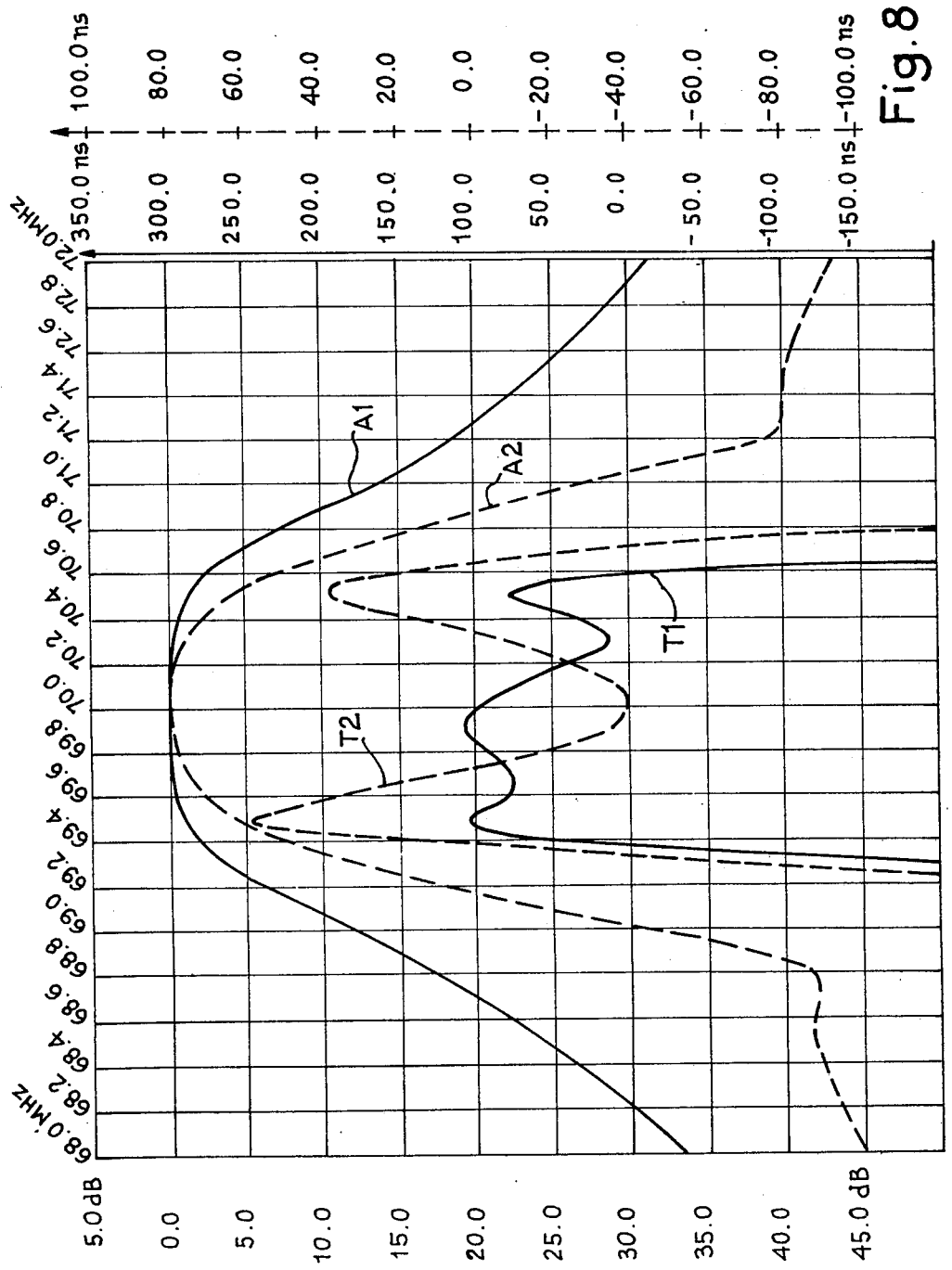
FIG. 8 illustrates amplitude and envelope delay curves for the second and third embodiments.

The amplitude curve A1 obtained for this second embodiment is shown in FIG. 8. It is identical to the amplitude curve A of the first embodiment shown in FIG. 3.

The envelope delay curve T1 is slightly modified between frequencies of 70 and 70.5 MHz. The envelope delay variations are represented on the ordinate axis appearing in dotted line form in FIG. 8. It can be seen that the time delay is slightly greater for this second embodiment than in the first embodiment according to FIG. 2 in this particular frequency range and the self-correction of the envelope delay is inferior. However, this second embodiment remains within the model for the ideal filter fixed for the optimization equations.

Figure 7:
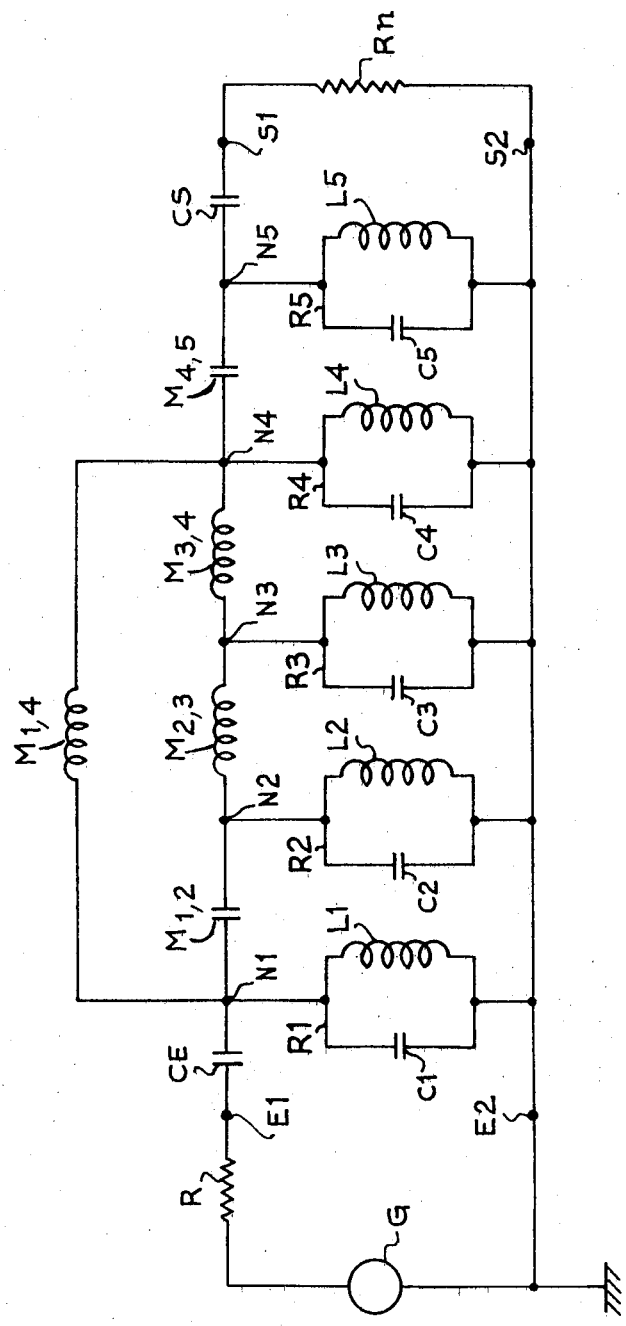
FIG. 7 shows a third embodiment of the filter according to the invention.

The following description refers to the circuit diagram of FIG. 1 and the embodiment of FIG. 7.

The supply and load conditions are the same as for the first two embodiments. The impedance matching devices CE and CS are unchanged and remain equal to 5.18 pF. The non-adjacent coupling means M1,2 and M4,5 are capacitive and the adjacent coupling means M2,3 and M3,4 self-inductive.

Only one secondary coupling means is used in the third embodiment and connects the first and fourth resonators, said coupling means M1,4 being self-inductive.

The following relationships and results are obtained:

M1,2=M4,5=0.59 pF

M2,3=M3,4=13417 nH

M1,4=1,000,000 nH

C1=C5=34.135 pF

C2=C4=39.555 pF

C3=40.535 pF

L1=L2= ... L5=130 nH

The results obtained for a centre frequency substantially equal to 70 MHz and a pass band roughly equal to 1.25 MHz. The amplitude curve A2 obtained for this third embodiment is also shown in FIG. 8. Amplitude curve A2 differs slightly from the two amplitude curves A and A1. Curve A2 has very significant attenuations beyond the critical frequencies, i.e. out-of-band. As a result the filter is more selective.

In the envelope delay variation curve T2 of FIG. 8, it is possible to see larger variations in the delay time. The envelope delay variations are shown on the ordinate axis in unbroken line form in FIG. 8.

The first and third embodiments show the independence of the envelope delay variation correction and the amplitude correction. The second embodiment is only a variant of the first embodiment.

The three embodiments described underwent a temperature variation test. The tests were performed between a minimum temperature substantially equal to $-30°$ C. and a maximum temperature substantially equal to $+70°$ C. After these tests the amplitude and envelope delay curves underwent minor variations and remain very close to the ideal response of the filter.

The results obtained are identical to those obtained by using filters, plus correcting devices. However, the overall dimensions are reduced by more than 50% and there is also no longer a thermal instability problem because no active element is used.

What is claimed is:

1. An odd order self-corrected electric filter with elements having localized constants comprising a first input and a second input, a first matching capacitor at the first input of the filter, five resonators in cascade, whereof a first is connected on the one hand to a first node and on the other to the second input, each resonator being constituted by a capacitor in parallel with an inductance, the filter also comprising a first capacitor connected between the first and second resonators, a first and a second inductance respectively connected between the second and third resonators and the third and fourth resonators, a second capacitor connected between the fourth and fifth resonators, a third and a fourth capacitor connected respectively between the first and fourth resonators and the second and fifth resonators in order to bring about a self-correction of the envelope delay.

2. An odd order self-corrected electric filter with elements having localized constants comprising a first input and a second input, a first matching capacitor at the first input of the filter, five resonators in cascade, whereof the first is connected on the one hand to a first node and on the other to the second input, each resonator being constituted by a capacitor in parallel with an inductance, the filter also comprising a first capacitor connected between the first and second resonators, a first and a second inductance connected respectively between the second and third resonators and the third and fourth resonators, a second capacitor connected between the fourth and fifth resonators, as well as a third inductance connected between the first and fourth resonators in order to bring about an amplitude correction.

* * * * *